United States Patent
Wunsch et al.

(10) Patent No.: US 11,517,873 B2
(45) Date of Patent: Dec. 6, 2022

(54) CONTROLLED CHEMICAL SYNTHESIS USING POLYMER SUBSTRATES AND NANOFLUIDIC SEPARATION SYSTEMS

(71) Applicant: International Business Machines Corporation, Armonk, NY (US)

(72) Inventors: Benjamin H. Wunsch, Mt. Kisco, NY (US); Stacey M. Gifford, Ridgefield, CT (US); Sung-Cheol Kim, New York, NY (US); Joshua T. Smith, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 16/667,898

(22) Filed: Oct. 29, 2019

(65) Prior Publication Data

US 2021/0121844 A1    Apr. 29, 2021

(51) Int. Cl.
*B01J 19/00* (2006.01)
*B01L 3/00* (2006.01)

(52) U.S. Cl.
CPC ..... *B01J 19/0046* (2013.01); *B01L 3/502753* (2013.01); *B01L 3/502761* (2013.01); *B01J 2219/0061* (2013.01); *B01J 2219/00527* (2013.01); *B01J 2219/00599* (2013.01); *B01L 2300/0896* (2013.01); *B81B 2201/058* (2013.01)

(58) Field of Classification Search
CPC .......... B01J 19/0046; B01J 2219/00527; B01J 2219/0059; B01J 19/00599; B01J 19/0061; B01J 19/00759; B01L 2300/0896; B01L 2300/502753; B01L 2300/502761; B01B 2201/058
See application file for complete search history.

(56) References Cited

U.S. PATENT DOCUMENTS

| 9,499,578 | B2 | 11/2016 | Rajasekaran et al. |
| 9,835,539 | B2 | 12/2017 | Astier et al. |
| 2004/0203085 | A1 | 10/2004 | Bernard et al. |
| 2012/0322692 | A1 | 12/2012 | Pham et al. |

(Continued)

FOREIGN PATENT DOCUMENTS

| EP | 1397216 B1 | 8/2007 |
| WO | 2018150281 A1 | 8/2018 |

OTHER PUBLICATIONS

Jo, Jeyun et al., Recent Advances in Substrate-Controlled Asymmetric Cyclization for Natural Product Synthesis, Molecules 2016, 21,1069, Jun. 26, 2017, pp. 1-18.

(Continued)

*Primary Examiner* — Jennifer Wecker
*Assistant Examiner* — Kathryn Elizabeth Limbaugh
(74) *Attorney, Agent, or Firm* — Daniel Morris; Otterstedt & Kammer PLLC

(57) ABSTRACT

Methods of liquid-phase synthesis of polymers using polymer substrates and systems for facilitating such methods allow gating of a synthetic reaction into a binary (reacted or unreacted) readout. Polymer substrates are used as carriers for molecular reagents and act as separation tags that allow them to be purified using nanoscale deterministic lateral displacement. Two polymer substrates are linked together by a bond-forming reaction to form a longer polymer that includes a synthetic product. The synthetic product can be purified away from unreacted polymers/reagents using strand-length dependent lateral displacement.

20 Claims, 10 Drawing Sheets

(56) References Cited

U.S. PATENT DOCUMENTS

| | | |
|---|---|---|
| 2014/0086806 A1 | 3/2014 | Li et al. |
| 2017/0136460 A1 | 5/2017 | Smith et al. |
| 2018/0078939 A1 | 3/2018 | Hu et al. |
| 2018/0080060 A1 | 3/2018 | Gifford et al. |
| 2019/0153516 A1 | 5/2019 | Gifford |
| 2019/0224677 A1 | 7/2019 | Smith et al. |
| 2019/0226953 A1 | 7/2019 | Wunsch et al. |
| 2019/0299208 A1 | 10/2019 | Pereira et al. |
| 2019/0300932 A1 | 10/2019 | Gifford |

OTHER PUBLICATIONS

De Bo, Guillaume et al., Efficient Assembly of Threaded Molecular Machines for Sequence-Specific Synthesis, Journal of the American Chemical Society 2014, 136, Mar. 28, 2014, pp. 5811-5814.
Zhang, Jihua et al., Synthesis of Sequence-Specific Vinyl Copolymers by Regioselective ROMP of Multiply Substituted Cyclooctenes, ACS Macro Letters 2012, 1, Nov. 26, 2012, pp. 1383-1387.
Zhu Ying CN as ISA. Patent Cooperation Treaty International Search Report and Written Opinion, PCT/IB2020/059194, dated Jan. 21, 2021, 7 pages.

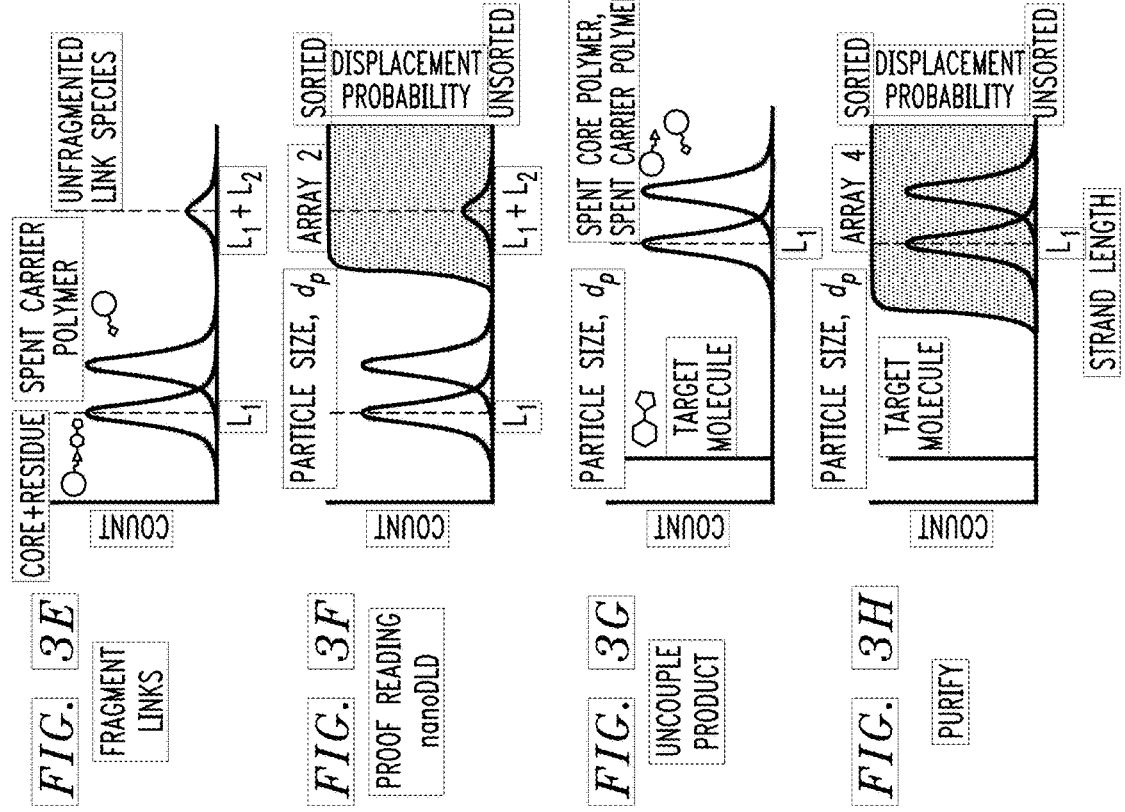
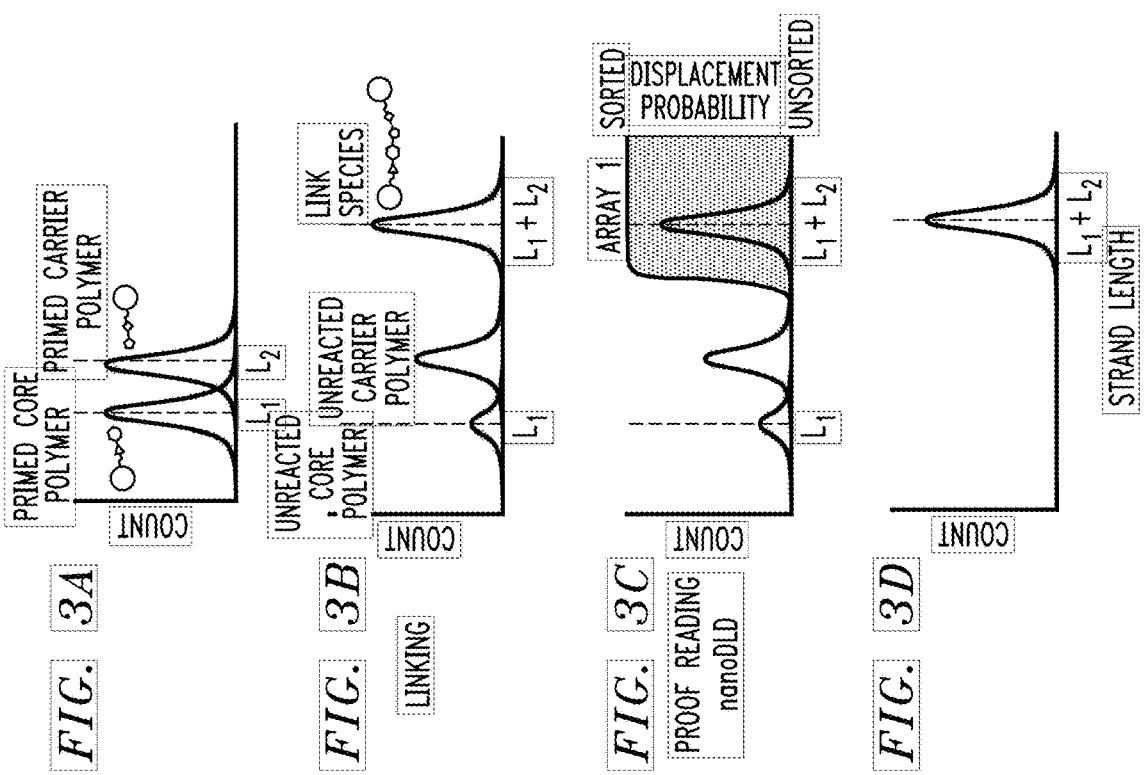

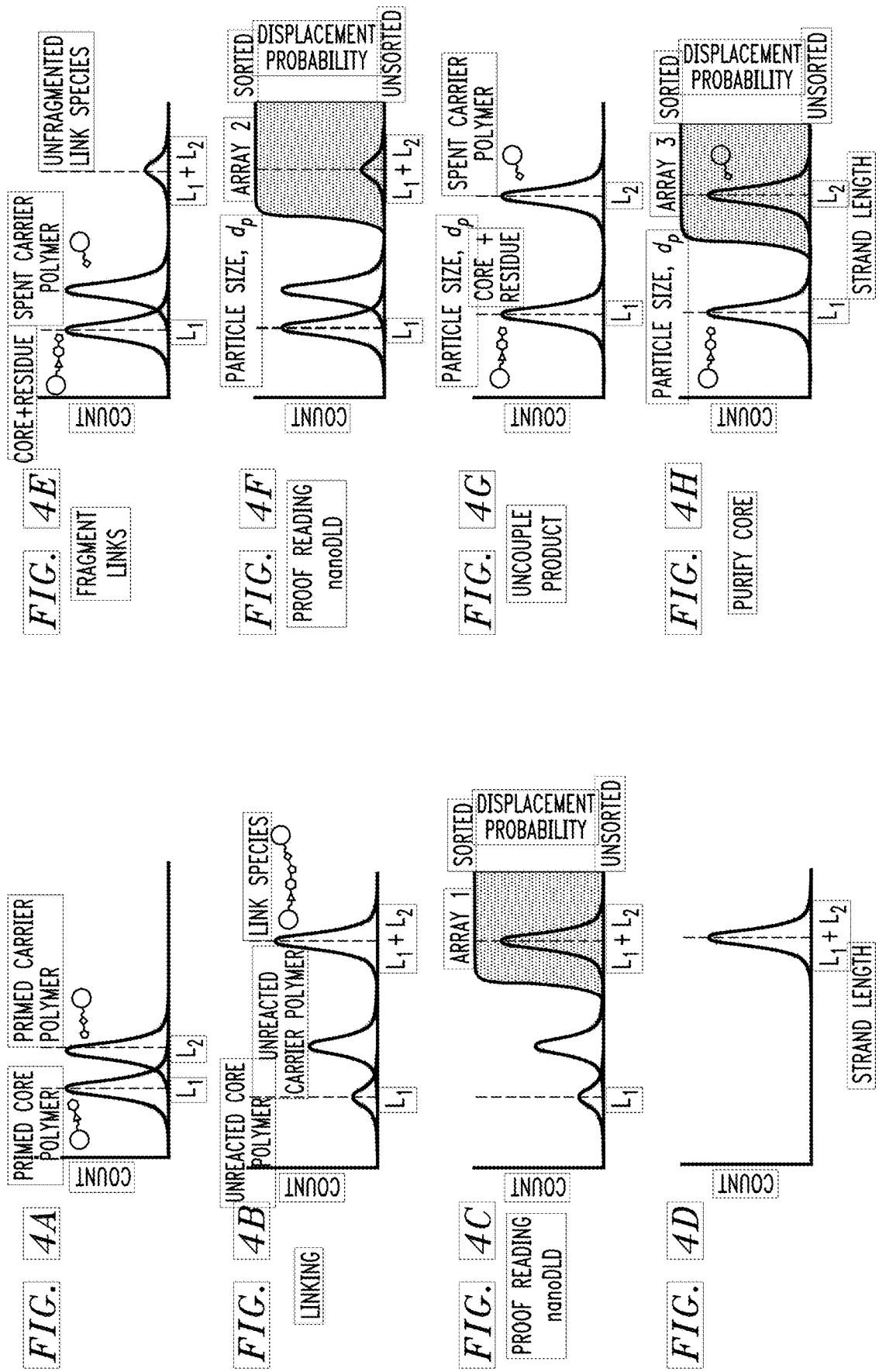

CONTROLLED CHEMICAL SYNTHESIS USING POLYMER SUBSTRATES AND NANOFLUIDIC SEPARATION SYSTEMS

BACKGROUND

The present application relates generally to the synthesis of small molecules and macromolecules and more particularly to liquid phase synthesis using nanoscale deterministic lateral displacement.

Chemical synthesis depends heavily on the capability to purify the molecular products created. An extensive arsenal of purification methods have been deployed for the synthesis of increasingly complex targets. These methods generally rely on asymmetric chemical potentials to drive separation. Size exclusion methods differentiate molecules by their average size and, thus their path tortuosity, in a porous media. Affinity chromatography uses differences in a physiochemical property such as hydrophobicity, charge state, or specific supramolecular recognition and binding to an immobilized moiety. Gel electrophoresis uses differences both in ion mobility and particle size. Distillation and sublimation uses differences in vapor pressure or sublimation point, respectively, between molecules. Ultracentrifugation uses differences in density.

Solid phase synthesis facilitates complex synthesis and purification by immobilizing species on a macroscopic/microscopic solid such as bead resin or porous media, which cannot pass through a filtering medium. Chemical species are reacted to the solid phase at the liquid/solid interface, and excess reagents are washed away and flow through a filtering medium away from the solid phase. The immobilized solid phase can then be reused for the next reaction step. Repeated application of liquid reagent and filtering of the solid phase allow the building up of larger molecules, which remain tethered to the solid's surface. The method allows an error limiting capability in synthesis: tethered constructs that fail to react can be "sealed" using a capping reagent which prevents further synthesis (generally by removing or altering the reactive moiety on the molecule). This allows failed targets to be removed from the synthetic pathway, but constitutes a yield loss and contamination which must be removed at the end stage when the molecular product is released from the solid phase.

Silicon based, on-chip nanofluidic devices represent a class of lab-on-chip devices with applications in biology, medicine, pharmaceuticals and agriculture. Silicon nanofluidic devices have advantages over their plastic-based counterparts, including scalability, ability to fabricate small feature sizes, and integration with on-chip electronics. Nanoscale deterministic lateral displacement ("nanoDLD") chips are a type of silicon nanofluidic device. NanoDLD includes asymmetric pillar arrays, with features sizes from 10 to 1,000 nanometers (nm), etched into fluidic channels in a silicon/silica substrate. NanoDLD technology allows size-based fractionation of colloids and sub-cellular components, ranging from 20 to 1,000 nm in diameter. The key design feature of nanoDLD is the gap size, ranging from 50 to 1,000 nm, which controls the size selectivity of the device. Nano deterministic lateral displacement (nanoDLD) can operate on the nano-mesoscale in the size range of most polymer colloids, can operate continuously, has good size selectivity for colloids in the >20 nm range and can be scaled for different sizes of reaction and throughput. Control of the flow velocity can be used to tune the separation resolution of polymer substrates in the nanoDLD array. An external pump or pneumatic source may be connected to a flow cell enclosing the nanofluidic chip to drive the fluid flow through the nanofluidic chip. A quantity of sample fluid is pressurized through the chip, and the output stream of different particle size fractions are collected in chambers within the flow cell. Parallel integration of nanoDLD devices for high density chips allows processing rates of about 1 milliliter per hour (mL/hr). Hydrodynamic focused arrays (HFA) and condenser focused arrays (CFA) are two types of nanoDLD arrays that can be employed for particle separation.

SUMMARY

Techniques and systems are provided for synthesizing molecules by incorporating polymer substrates and nanostructured separation devices.

In one aspect, an exemplary method of synthesizing molecules includes providing a first mixture of core polymers and carrier polymers, the core polymers and the carrier polymers including tether bonds and reagents, and forming linking bonds between the core polymers and the carrier polymers, thereby obtaining a second mixture comprising link species including the linking bonds. The link species are separated from the core polymers and the carrier polymers remaining within the second mixture by flowing the second mixture through a first nanoDLD array configured to separate the link species from the core polymers and the carrier polymers and diverting the link species away from the core polymers and the carrier polymers in the first nanoDLD array. The method further includes fragmenting the link species. The invention enables carrying out synthesis and purification by advantageously linking two polymers together, thereby increasing the overall constructs length. The length increase (amplification) is used to discern between reacted products and unreacted reagents.

Fragmenting the link species forms a third mixture including core plus residue polymers, spent carrier polymers and unfragmented link species. In some embodiments, the method includes separating the unfragmented link species from the core plus residue polymers and the spent carrier polymers. The third mixture is flowed through a second nanoDLD array configured to separate the unfragmented link species from the core plus residue polymers and the spent carrier polymers. In some preferred embodiments, target molecules are uncoupled from the core plus residue polymers, thereby forming a target molecule mixture including the target molecules, spent core polymers, and spent carrier polymers. The target molecules within the target molecule mixture are separated from the spent core polymers and the spent carrier polymers. The separation of the target molecules from the spent core polymers and the spent carrier polymers includes, in some embodiments, flowing the target molecule mixture through a hydrodynamic focused nanoDLD array configured to separate the spent core polymers and the spent carrier polymers from the target molecules.

The exemplary method can further include collecting the core plus residue polymers from the third nanoDLD array, obtaining an initial mixture including the core plus residue polymers and further carrier polymers, and forming further linking bonds between the core plus residue polymers and the further carrier polymers. Further link species including the further linking bonds and the further carrier polymers are accordingly obtained. The further carrier polymers within the initial mixture may include reagents having different molecular constituencies with respect to the reagents of the carrier polymers within the first mixture. Molecular products with specific sequences of molecular species can optionally be generated using carrier polymers with different molecular reagents in various stages of the method. The further link species can be fragmented in a subsequent step of the method.

A system for synthesizing molecules includes a linking reactor for forming linking bonds between reagents connected, respectively, to core polymers and carrier polymers within a first mixture, thereby obtaining a second mixture comprising link species including the linking bonds. A first nanoDLD array is configured for separating the link species within the second mixture. A fragmenting reactor is configured for fragmenting the link species, thereby forming a third mixture including unfragmented link species, core plus residue polymers comprising the linking bonds, and spent carrier polymers. The system further includes a second nanoDLD array configured for separating the unfragmented link species from the core plus residue polymers and the spent carrier polymers within the third mixture and an uncoupling reactor configured for uncoupling target molecules comprising the linking bonds from the core plus residue polymers. A third nanoDLD array configured for separating the core plus residue polymers from the spent carrier polymers may further be incorporated within the system.

Techniques as disclosed herein can provide substantial beneficial technical effects. By way of example only and without limitation, one or more embodiments may provide one or more of the following advantages:

- Proof-reading of chemical reactions by reading out the displacement (size) of the polymer construct;
- Ability to recycle reagents by collecting unreacted polymer substrates;
- Single particle (molecular product) interrogation by the nanostructure separators;
- Continuous operation.

BRIEF DESCRIPTION OF THE DRAWINGS

The following drawings are presented by way of example only and without limitation, wherein like reference numerals (when used) indicate corresponding elements throughout the several views, and wherein:

FIG. 1A is a schematic representation of a polymer link species obtained during the exemplary scheme of FIG. 1;

FIG. 3A schematically illustrates a first stage of molecule synthesis using polymer substrates and nanoscale deterministic lateral displacement (nanoDLD);

FIG. 3B schematically illustrates a second stage of molecule synthesis using polymer substrates and nanoscale deterministic lateral displacement;

FIG. 3C schematically illustrates a third stage of molecule synthesis using polymer substrates and nanoscale deterministic lateral displacement;

FIG. 3D schematically illustrates a fourth stage of molecule synthesis using polymer substrates and nanoscale deterministic lateral displacement;

FIG. 3E schematically illustrates a fifth stage of molecule synthesis using polymer substrates and nanoscale deterministic lateral displacement;

FIG. 3F schematically illustrates a sixth stage of molecule synthesis using polymer substrates and nanoscale deterministic lateral displacement;

FIG. 3G schematically illustrates a seventh stage of molecule synthesis using polymer substrates and nanoscale deterministic lateral displacement;

FIG. 3H schematically illustrates an eighth stage of molecule synthesis using polymer substrates and nanoscale deterministic lateral displacement;

FIGS. 4A-4H schematically illustrate an exemplary variation of the molecular synthesis scheme shown in FIGS. 3A-3H;

Figure 1:
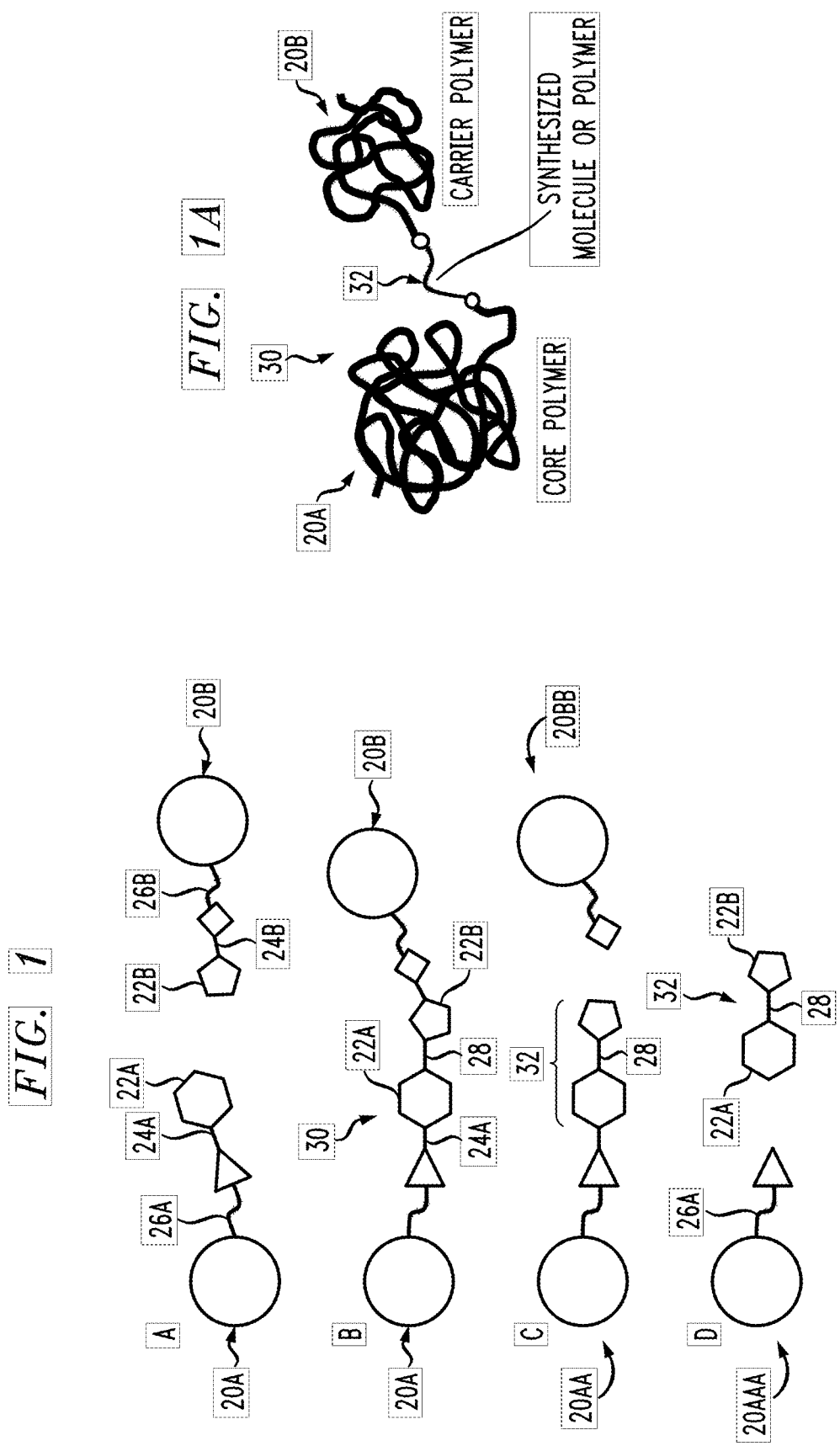
FIG. 1 schematically illustrates an exemplary scheme for using size dependent polymers for molecule synthesis.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

The invention relates to methods for carrying out synthesis using polymer substrates and nanofluidic devices and structures for implementing such methods. Exemplary methods in accordance with invention allow gating of a synthetic reaction into a binary read-out: reacted or not-reacted. This occurs by mapping the length of the polymer substrates to the ability to purify the polymer (and its products) out of a reaction mixture. When a successful chemical reaction occurs, this links two polymer substrates together, increasing the overall constructs length. The length increase (amplification) can be used to discern between reacted products and unreacted reagents.

The current inventions improve upon the error-correction capability of solid phase synthesis by mapping bond formation or bond cleavage to the size of the construct formed from these reactions. The size change amplifies the results of the reaction, which are then read-out by a separation process. Nano deterministic lateral displacement (nanoDLD) provides an excellent separation method as it can operate on the nano-mesoscale in the size range of most polymer colloids, can operate continuously, has good size selectivity for colloids in the >20 nm range, interrogates single particles independently for size separation (i.e. for a wide range of concentrations, the separation is affinity independent) and can be scaled for different sizes of reaction and throughput. DLD arrays can laterally displace target molecules within a sample stream based on size. Rows of pillars comprising a nanoDLD lattice structure can be positioned offset of each other at a defined angle and the pillars can be separated from each other by a defined gap size. The defined angle and/or gap size can facilitate displacement of one or more molecules of a target size range within a stream flowing through the nanoDLD array. In accordance with one or more embodiments of the invention, nanoDLD is used in novel ways for carrying out synthesis methods.

The invention contributes to the synthesis of small molecules and macromolecules by incorporating polymer substrates and nanostructured separation devices. Polymer substrates serve as carriers for molecular reagents and act as "separation tags" which allow them to be purified using nanoscale deterministic lateral displacement (nanoDLD). When two polymer substrates are linked together by a bond-forming reaction, they form a larger (longer) polymer welded together by the synthetic product. The synthetic product can be purified away from the unreacted polymers/reagents using strand-length dependent lateral displacement. This process constitutes a "proof-reading" stage based on size (length) amplification of reacted products, enabling a new method of error checking reactions on an individual molecular basis. Methods in accordance with the invention advance the field of liquid phase synthesis and homogeneous ligation/condensation synthesis by enabling proof-reading and providing a continuous, single particle (product) separation scheme.

Polymers, including dsDNA, in the 1000s-100,000s Da and greater range can be displaced in nanoDLD nanofluidic devices. This allows lateral separation and purification of polymers based on size (backbone length) in a continuous flow process. The length of the polymer determines the degree of lateral displacement and thus the resolution limit and selectivity of separating out the polymer. A longer polymer will generally displace more than a smaller one, allowing the larger particle to be laterally translocated away from the smaller polymer, simultaneously purifying both polymer lengths. By selecting the dimensions of the nanoDLD array, it is possible to determine the separation resolution of two polymers down to at least 1000 Da. For purposes of convenience, the word "size" as used herein will be taken to be synonymous with the backbone length of the polymer. The degree of displacement depends on the persistence length of the polymer and the speed at which it is translocated through the nanoDLD array.

The size dependent displacement of polymers in nanoDLD allows for the error checking of synthetic reactions. Synthetic reactions are taken to be any chemical or physical reaction that brings two molecules or colloids together in a bond strong enough to not be broken by any conditions of the separation process in a microfluidic/nanofluidic device or nanostructured array. The formation of a bond between two reagents to form a product can serve to weld two polymers together to form a longer polymer. Judicious selection of a nanoDLD array can allow separation of the longer linked polymers from the smaller sub-components, forming the basis of sorting out successful reactions and aiding in purification.

A scheme for using size dependent polymers for synthesis is outlined in FIG. 1. Referring to stage A of FIG. 1, two polymer substrates, the core 20A and carrier 20B polymers, are synthesized to specific molecular weight (or polydispersity limit). The core and carrier polymers have a length defined by the elongation length (or alternatively number of residue units), $L_1$ and $L_2$ respectively. The end groups of the core and carrier polymers are the molecular reagents 22A, 22B which are tethered to their respective polymers by bonds 24A, 24B. Coupling groups 26A, 26B on the ends of the polymers provide compatible moieties to form the required tethering bonds 24A, 24B. The tethering bonds are labile enough that mild reaction conditions can be used to cleave these bonds at a desired stage. Mild reaction conditions constitute those that do not destroy or degrade the polymers or reaction products. The uncoupling chemistries for the core and carrier tethering bonds 24A, 24B are orthogonal to allow selective cleavage of one bond in the presence of the other at a desired stage.

The molecular reagents on the core and the carrier are reacted together during stage B (FIG. 1) to form a linking bond 28 which forms a longer polymer, the link species 30, out of the core and carrier sub-units. The link species 30 has a length of $L_1+L_2$. FIG. 1A shows a schematic representation of the longer polymer obtained in stage B of FIG. 1. The linking bond 28 must in general be of a higher stability than the tethering bonds 24A, 24B. The link species can be purified away from the substrate polymers in stages C and D (FIG. 1) using nanoDLD (vida infra). To release the molecular product 32, the tethering bonds 24A, 24B on the carrier and core polymers 20A, 20B can be simultaneously or sequentially removed and the polymers purified away from the product using nanoDLD (vida infra). Spent core and carrier polymers (including attached coupling groups) are designated by numerals 20AAA and 20BB, respectively, in FIG. 1. A core+residue polymer obtained by fragmenting the link species 30 is designated by numeral 20AA.

Figure 2:
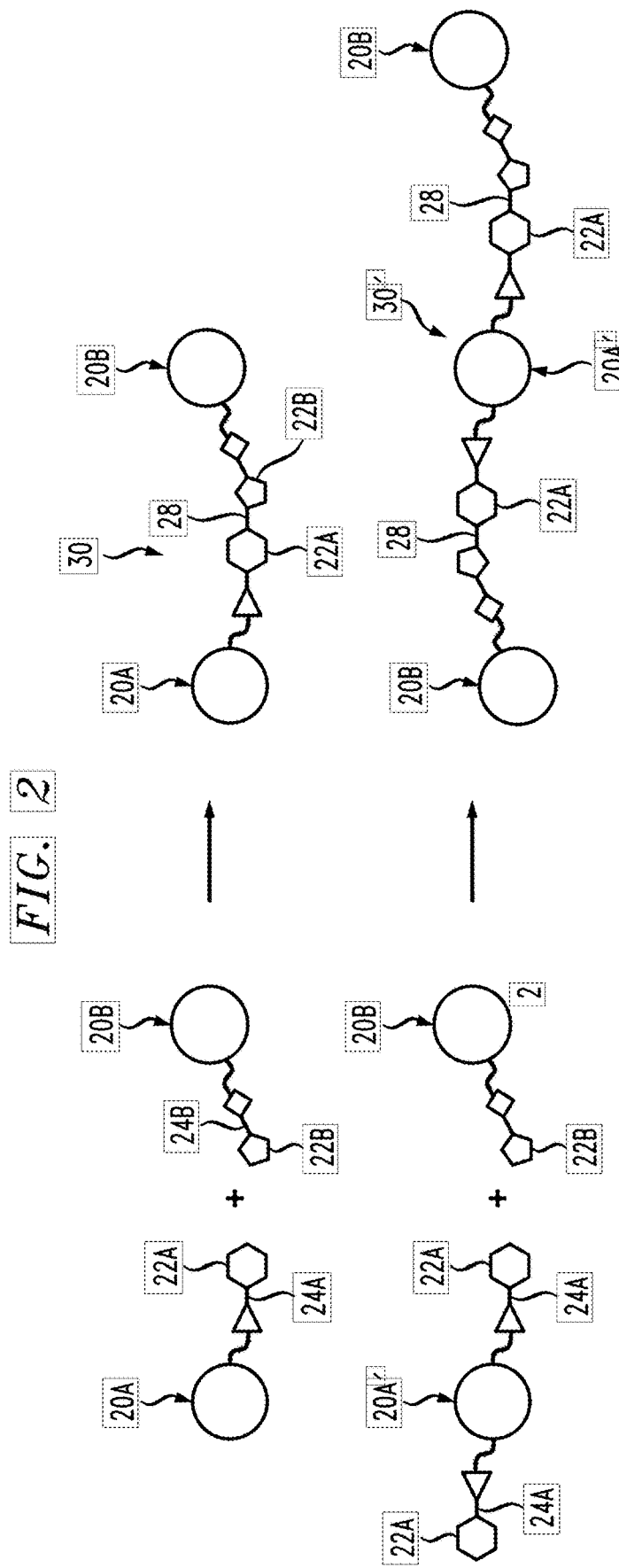
FIG. 2 schematically illustrates a variation of the scheme shown in FIG. 1.

A variation on the reaction scheme uses both ends of the core polymer 20A, as shown in the lower portion of FIG. 2, the upper portion of the figure showing the reaction scheme using only one end of the core polymer. In this scheme, one core polymer 20A' is reacted with two carrier polymers 20B to form a link species 30' of length $L_1+2L_2$. This allows a longer link polymer to be formed from the sub-unit polymers, providing a means for higher separation resolution. Preferably the core and carrier polymers (20A or 20A' and 20B) do not form secondary or tertiary structures which may distort their natural coil state. The core and carrier polymers should not aggregate and should not bind together to form an aggregate or quaternary structure. It is recognized the polymers 20A, 20B should not have a binding affinity or other supramolecular or chemical reaction with the reagents or products to which they are bound.

NanoDLD separation depends on the length of the polymer. For a given gap size, longer polymers have higher displacement. A given nanoDLD exhibits a displacement probability (efficiency) as a function of polymer length (strand length), giving a low pass (Z-mode) fraction which is not displaced, and a bumped (B-mode) fraction which is displaced. The transition from Z-mode to B-mode is generally not binary, but is centered around a cut-off length, $L_c$. When a mixture of polymers is flowed into a nanoDLD, polymers of length $L<L_c$ pass through the array in Z-mode, while polymers of length $L>L_c$ are displaced to the edge of the array. The two fractions can be diverted into separate channels to collect as separate solutions. Polymers of length $L \sim L_c$ will exhibit a partial bumping mode, PB-mode, and the degree to which they are collected into the Z or B-mode fractions depends on the specific design of the array and the nanofluidic channels that connect to it.

FIGS. 3A-3H outline schematically the stages A-H, respectively, for synthesis using the polymer substrates and nanoDLD, illustrating each stage in the form of a population histogram for the different species involved. To begin starting with stage A, a mixture of core and carrier polymers, primed with their respective reagents, are reacted together (linking stage B). Linking can involve using any type of chemistry to form the linking bond, and can be performed with traditional homogenous or heterogeneous methods, using natural products or synthetic materials, using, for example, micro or nanofluidic reactors, fermentation, or enzymatic chemistry on any scale required, from large industrial reactors, table-top or research grade reaction scales, down to microfluidic or smaller levels of product. The details of the invention are agnostic to the specifics of the reaction chemistry, insofar as the linking bond formed welds the core and carrier polymers into a single link species such as that illustrated in FIG. 1A. After linking, the populations of free core and carrier polymers will decrease, and a population of link species having the length $L_1+L_2$ (or alternatively, $L_1+2L_2$) will have formed (stage B).

A nanoDLD array (array 1 in FIG. 3C) is used to separate the link species from the unreacted core and carrier polymers (stage C). This constitutes a "proof-reading" step, in which successful chemical reactions are screened away from unreacted species. Array 1's $L_c$ is chosen so that the link species enters into B-mode, while the unreacted core and carrier polymers (polymers 20A, 20B in FIG. 1A) enter into Z-mode (or a weak PB-mode), facilitating separation. The result of the array 1 proof-reading is a purified population of link species (stage D), each having a strand length of $L_1+L_2$ in the exemplary embodiment. Next, the link species are fragmented using an uncoupling chemistry which cleaves at least the carrier polymer tether bond (24B in FIG. 1) and possibly the tether bonds of both the core and carrier polymers, thereby liberating the molecular product (target molecule 32 in FIG. 1).

In the chemical synthesis outlined in FIGS. 3A-3H, fragmenting only the carrier link produces the profile shown in stage E (FIG. 3E), including the potential for a population of residual, unfragmented species, whereas fragmenting both the core and carrier links produces the profile shown in stage G (FIG. 3G) (where the residual unfragmented species have been omitted from the schematic). The choice as to whether to cleave one or both of the linkage bonds depends on whether subsequent chemistry will be performed (for example, see below) on the target molecule 32, in which case keeping the target molecule tethered to the core (the "core+residue" molecule in FIG. 3E) can assist in downstream purification and stage E is the preferred approach. If the target molecule 32 is complete, then skipping directly to uncoupling all polymers is acceptable, and stage G is the preferred approach. If complete uncoupling of all polymers is carried out, the target molecule 32 is released and a final purification step can be performed with nanoDLD to remove the spent polymers and any residual unfragmented species. The details of the invention are not dependent on the specifics of the uncoupling chemistry, insofar as the tether bonds are broken selectively as opposed to the linking bond or any other bonds within the core or carrier polymer or the molecular product (target molecules).

A nanoDLD array (array 2) can be used to separate unfragmented links 30 from the core/carriers 20AA, 20BB in stage F, as outlined in FIG. 3F. This constitutes another proof-reading step, in which successful chemical reactions are screened away from unreacted species. Array 2's $L_c$ is the same as used in Array 1 (stage C) with the core and spent carrier polymers 20AA, 20BB entering into Z-mode (or a weak PB-mode), and the Z-mode fraction being collected since this has the tethered target molecule. The molecular product (target molecule) can then be uncoupled in stage G. The molecular product 32 within the resulting mixture is purified away using a nanoDLD (array 4) which separates out the spent core and carrier polymers. $L_c$ is chosen so that the spent core and carrier polymers enter into B-mode while the molecular product (for example, target molecule 32 in FIG. 1) enters into Z-mode, facilitating separation. It is appreciated that, in some embodiments of the invention, a single array could be used in place of arrays 2 and 4, simplifying the scheme requirements. A constraint on the molecular product is that it is smaller than any of the polymers used, or that it is of a size L sufficiently unique to be separable by a nanoDLD array from the core and carriers, and such that it allows a sufficient size difference between the core polymers, carrier polymers and the link species.

FIGS. 4A-4H outline a variation on the synthesis scheme seen in FIGS. 3A-3H. In this scheme, the linking, proofreading and fragmenting stages are as described above. Array 2 is an optional stage to remove residual unfragmented species if this is a stringent requirement on downstream chemistry. Stage G in FIG. 4G shows the remaining core plus target ("core+residue" in the figure) molecule and spent carrier polymers (note the adjusted scaling in the strand length axis). In this scheme, the core plus target molecule (20AA in FIG. 1) can be recycled for additional rounds of synthesis and purification, adding additional molecular segments (monomers, residues) to the product with each cycle of synthesis. Recycled core plus target molecule polymers can be activated (primed) with new reagents (tether bond formation) and then reacted with further carrier polymers (linking bond formation) to restart the synthesis cycle. This process elongates the product (target molecule) by one molecular segment each cycle, building a linear polymer with repeated cycles. This variation could be used to synthesis polymers of a specific molecular weight (residue number) or to produce polymers of a specified sequence of molecular segments. This variation requires an additional nanoDLD array (array 3) which is used to separate the core+product 20AA (alternatively, core+residue) from the spent carriers (stage H in FIG. 4H). Array 3's $L_c$ is chosen so that the spent carrier polymers (20BB in FIG. 1) enter into B-mode, while the core polymer+product (20AA in FIG. 1) enters into Z-mode, facilitating separation. The collected core polymer+product species can then been fed back into a reactor to couple another molecular reagent (tied to a carrier polymer) and repeat the separation cycles, as outlined schematically in FIG. 5. It is not mandatory that spent carriers be removed at this stage, as the subsequent linking and purification stages (stages A-C, FIGS. 4A-4C) with the core can occur, agnostic to the spent carrier population. However, in one embodiment, if considerable side-reactions can occur between additional chemistry (stage B, FIG. 4B) and spent carriers, this stage H of purification is necessary. In one embodiment, residual spent carriers are removed by the same Array 1 that separates linked species from unreacted cores and carriers (stage C, FIG. 4C). After the required number of cycles has been completed, the final molecular product (a polymer or macromolecule itself) can be released by uncoupling the core+residue polymer 20AA from the molecular product using array 4 (FIG. 3G, FIG. 3H). In this variation, the same core polymers are continuously recycled to accrue the growing molecular product.

Figure 5:
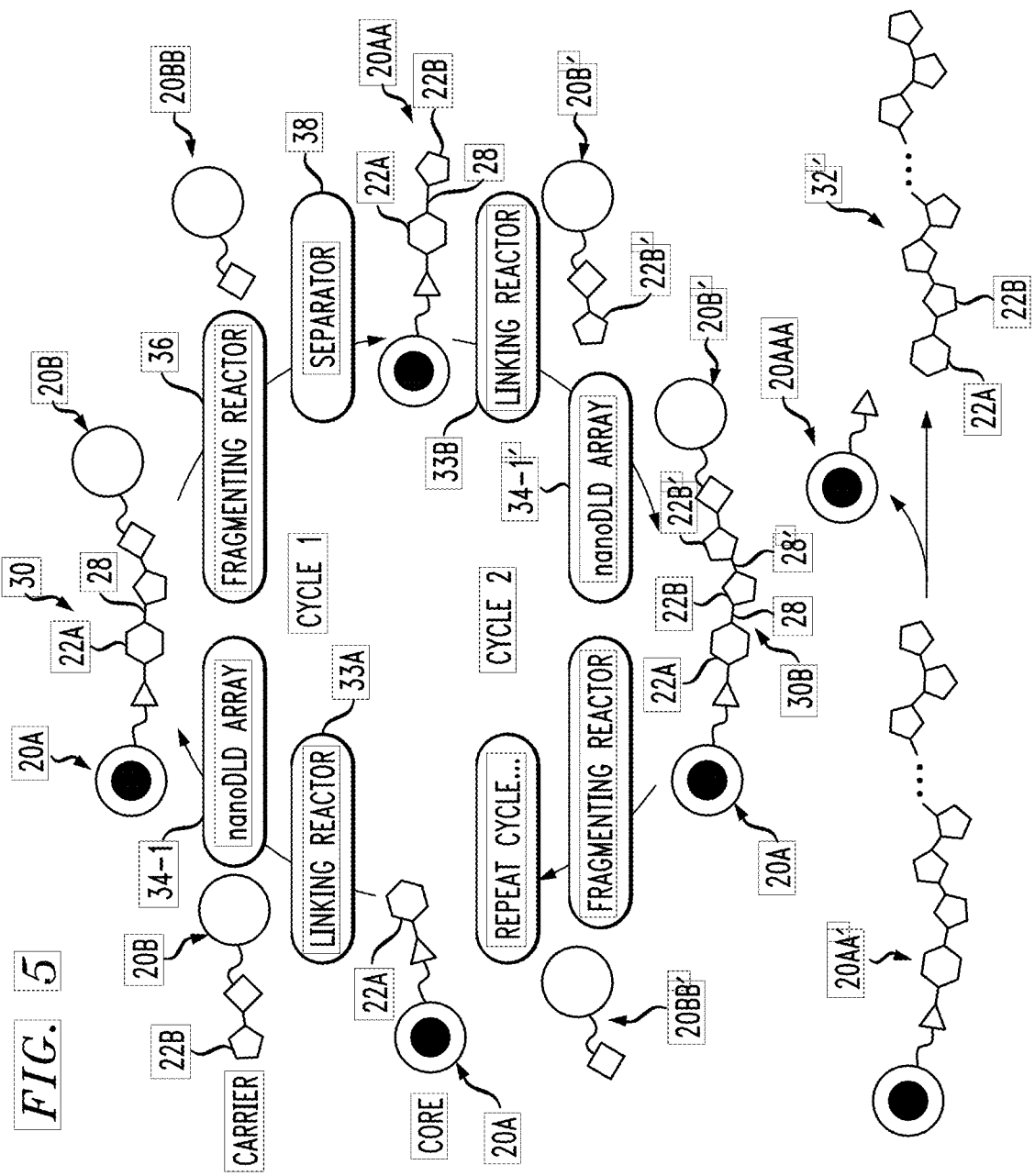
FIG. 5 is a flow diagram schematically illustrating an exemplary synthesis scheme including repetition of separation cycles.

FIG. 5 schematically outlines a sequence of events that is used to iteratively add monomers to the target molecules. The schematic shows two cycles (Cycle 1 and Cycle 2) in which two monomers are added to the core polymer. As shown in Cycle 1, the core and carrier polymers 20A, 20B are introduced to a linking reactor 33A to form the link species 30. The link species and unreacted polymers are then separated using a nanoDLD array 34-1 (corresponding to Array 1 in FIG. 4). A fragmenting reactor 36 is employed to fragment the link species 30 (stage E of FIG. 4), thereby forming core+residue polymers 20AA and spent carrier polymers 20BB lacking attached reagents 22B. A "separator" 38 is employed to sort the unfragmented link species and to purify the strands comprising the core polymers. The separator 38 includes Array 2 and Array 3 as designated in stages F and H of FIG. 4. In Cycle 2, the strand 20AA obtained in Cycle 1 and a new carrier polymer 20B' with attached reagent 22B' are introduced into a linking reactor 33B, which may or may not be the same linking reactor 33A used in Cycle 1. A mixture including link species 30B and unreacted strands is obtained, the new bonding link being designated by numeral 28'. The mixture is processed in a nanoDLD array 34-1' wherein the link species 30B enters into B-mode while the unreacted strands enter into Z-mode (or a weak PB-mode), facilitating separation. A fragmenting reactor 36' is employed to fragment the link species 30B, resulting in a mixture containing spent carrier polymers 20BB' and core polymers, the core polymers having additional molecular product attached thereto (strand 20AA') as compared to the strand 20AA obtained at the end of Cycle 1. The core plus residue polymer 20AA' as shown in FIG. 5 is obtained by performing multiple cycles. The molecular product 32' is eventually uncoupled from the core plus residue polymer 20AA' following completion of a requisite number of cycles, as schematically illustrated at the bottom of FIG. 5 and in stages G and H (FIGS. 3G, 3H).

It is appreciated that the polymer sizes for the core and carrier polymers can be inverted, $L_1 > L_2$, so that the core polymer enters into B-mode while the carrier polymer enters into Z-mode. The effect of this inversion of size is null on the length of the link species 30, 30', or on the results of the separation processes with nanoDLD.

It is appreciated that a variation on this scheme is to make the core or carrier polymer a desired part of the final product, whether through the addition of small molecular monomers to the polymer end, or in linking two polymers together to generate a link as the final product.

Figure 6:
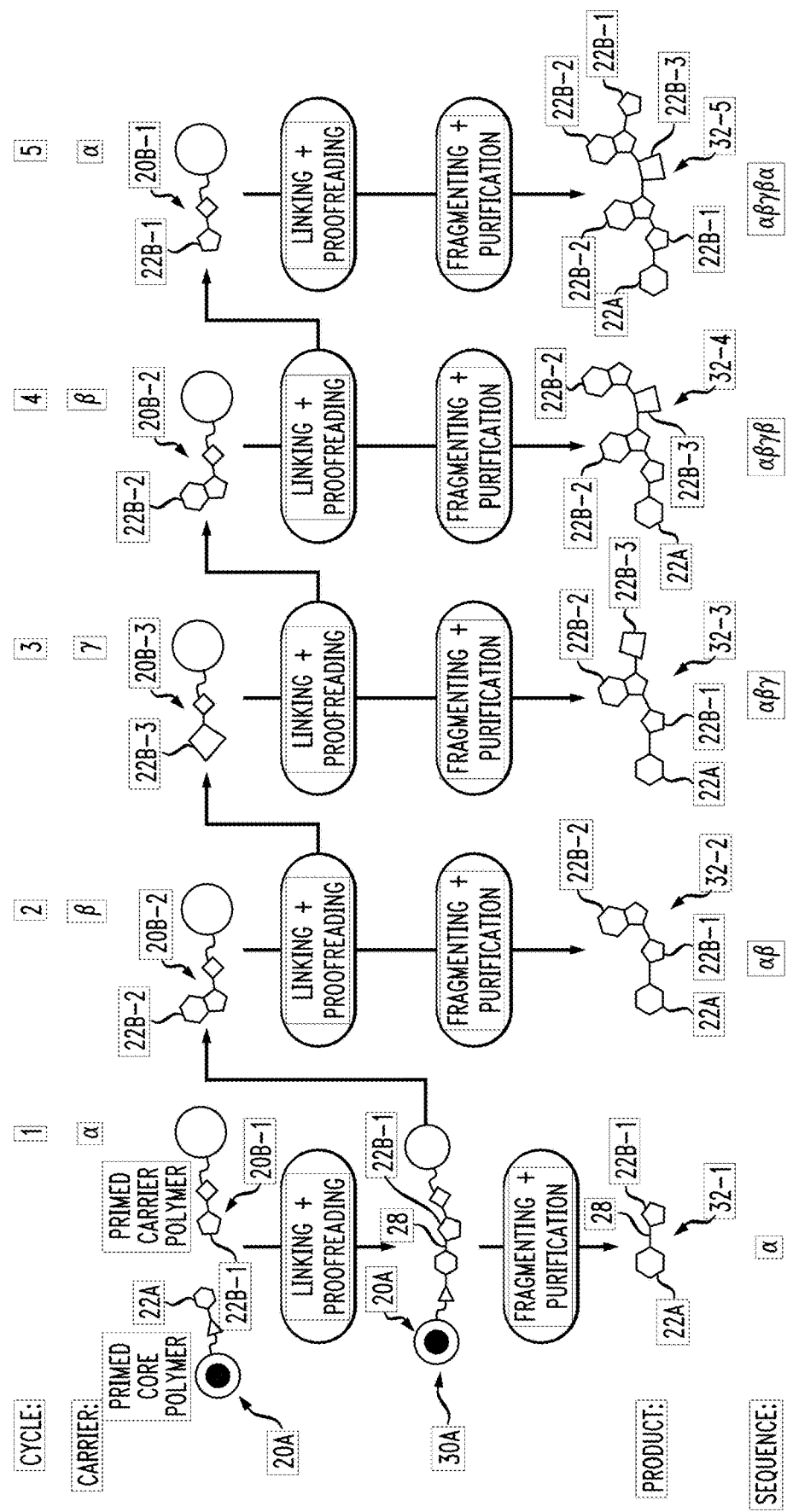
FIG. 6 includes schematic illustrations of exemplary products obtained using the synthesis scheme shown in FIG. 5.

FIG. 6 shows a schematic example of using the synthetic scheme outlined above to generate molecular products with specific sequences of molecular species. In this scheme, each cycle represents the linking and subsequent nanoDLD processes described above. Different carrier polymers 20B-1, 20B-2, 20B-3, each with a unique molecular reagent 22B-1, 22B-2, 22B-3, are used for each cycle. The coupling/uncoupling chemistries for making the linking bond 28 (as shown in the link species 30A) and breaking the tethering bonds is the same for each reagent, but the molecular constituency of the reagent (monomer) can be different (e.g. hydrophobic versus hydrophilic, acidic versus basic, aromatic versus aliphatic, enantiomeric, isomeric, structurally different, etc.). In the example outlined in FIG. 6, three different carrier polymers, α β γ, are used to construct a molecular product 32-5 that is five residues long and with a specific residue sequence of α β γ β α by changing the carrier polymer used in each synthetic cycle. At any point in the sequence the core polymer and molecular product can be cleaved, and the released molecular product (32-1, 32-2, 32-3, 32-4 or 32-5) is some sub-sequence determined by the number of cycles it has undergone up to that point.

Figure 7:
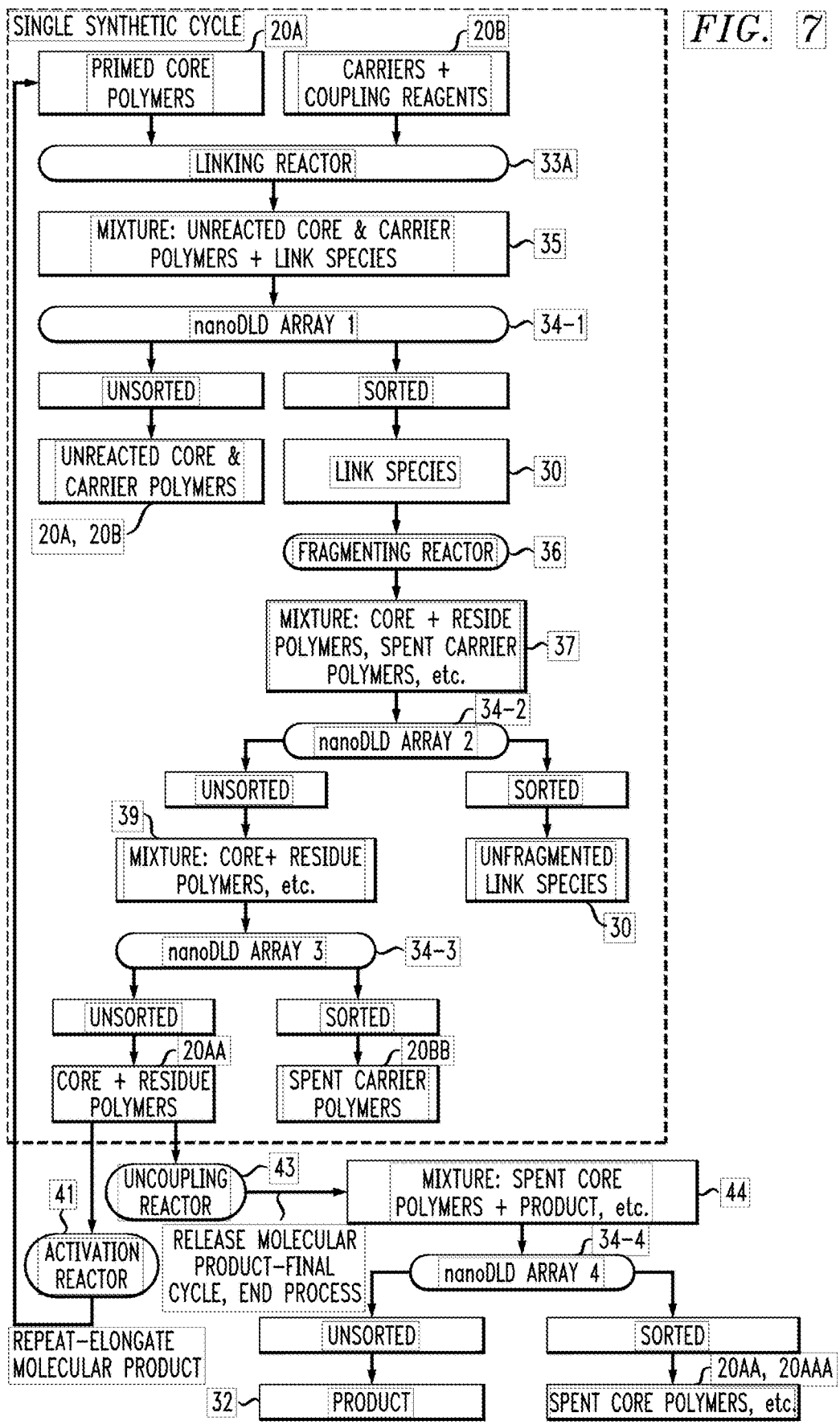
FIG. 7 is a flow diagram showing steps of a single synthetic cycle using a sequence of nanoDLD arrays.

FIG. 7 is a flow diagram that outlines the steps required for executing an exemplary method, highlighting the steps constituting a single synthetic cycle. Depending on the size of the final molecular product, the process can stop after one synthetic cycle, or continuously fed-back to elaborate the molecular product with sequential cycles, as discussed above with respect to FIGS. 3, 4 and 5. Primed core polymers and carrier polymers with coupling reagents as described above are introduced to a linking reactor 33A. The primed polymer substrates comprise a first mixture prior to linking. FIG. 1 schematically illustrates exemplary core and carrier polymers in Stage A of the depicted scheme. A second mixture 35 of unreacted core and carrier polymers 20A, 20B and link species 30 (or 30') is formed within the linking reactor 33A. This mixture is flowed through a first nanoDLD array 34-1 that separates the link species 30 from the unreacted core and carrier polymers 20A, 20B. The sorted link species 30 is processed in a fragmenting reactor 36. A third mixture 37 comprising core+residue polymers (20AA in FIG. 1), spent carrier polymers (20BB in FIG. 1), and unfragmented link species 30 is obtained. This mixture 37 is processed by a second nanoDLD array 34-2. The unfragmented link species 30 are separated from a mixture 39 of core+residue polymers 20AA and spent carrier polymers 20BB by the second array. The resulting mixture 39 is flowed through a third nanoDLD array 34-3 wherein the core+residue polymers 20AA are separated from the spent carrier polymers 20BB.

Once the core+residue polymers 20AA have been purified, they may be directed to either an activation reactor 41 or to an uncoupling reactor 43. In embodiments wherein no further additions to the molecular products are required, the molecular products are uncoupled from the core+residue polymers 20AA. A mixture 44 comprising core+residue polymers 20AA, spent core polymers 20AAA, and molecular products 32 ("product" in FIG. 7) is obtained. This mixture is flowed through a fourth nanoDLD array 34-4 where the molecular products 32 are separated from uncoupled core+residue polymers 20AA and the spent core polymers 20AAA. (As discussed below, the final purification stage may be conducted using a filter medium instead of the fourth nanoDLD array.)

In embodiments where the molecular product requires further steps for completion, the purified core+residue polymers 20AA are directed to the activation reactor 41. The activation reactor is included to account for embodiments in which the target molecule (which is tethered to the core polymer) must be transformed chemically to accept the next cycle of linking to a carrier. This activation could be a de-protection step in which a moiety that has been concealing a reacting group is removed, or an activation step in which a chemically inert moiety is transformed into a reactive species. In one embodiment the activation reactor is not necessary, as the target molecule can proceed with the next linking chemistry without any activation. This may be true in cases where the macromolecule is being synthesized by tail growth, or where either the fragmentation chemistry or linking chemistry pre-activate the target molecule automatically. The preceding steps are essentially repeated using new carrier polymers, such as the carrier polymers discussed above with respect to FIG. 6, to further elongate the molecular product.

Figure 8:
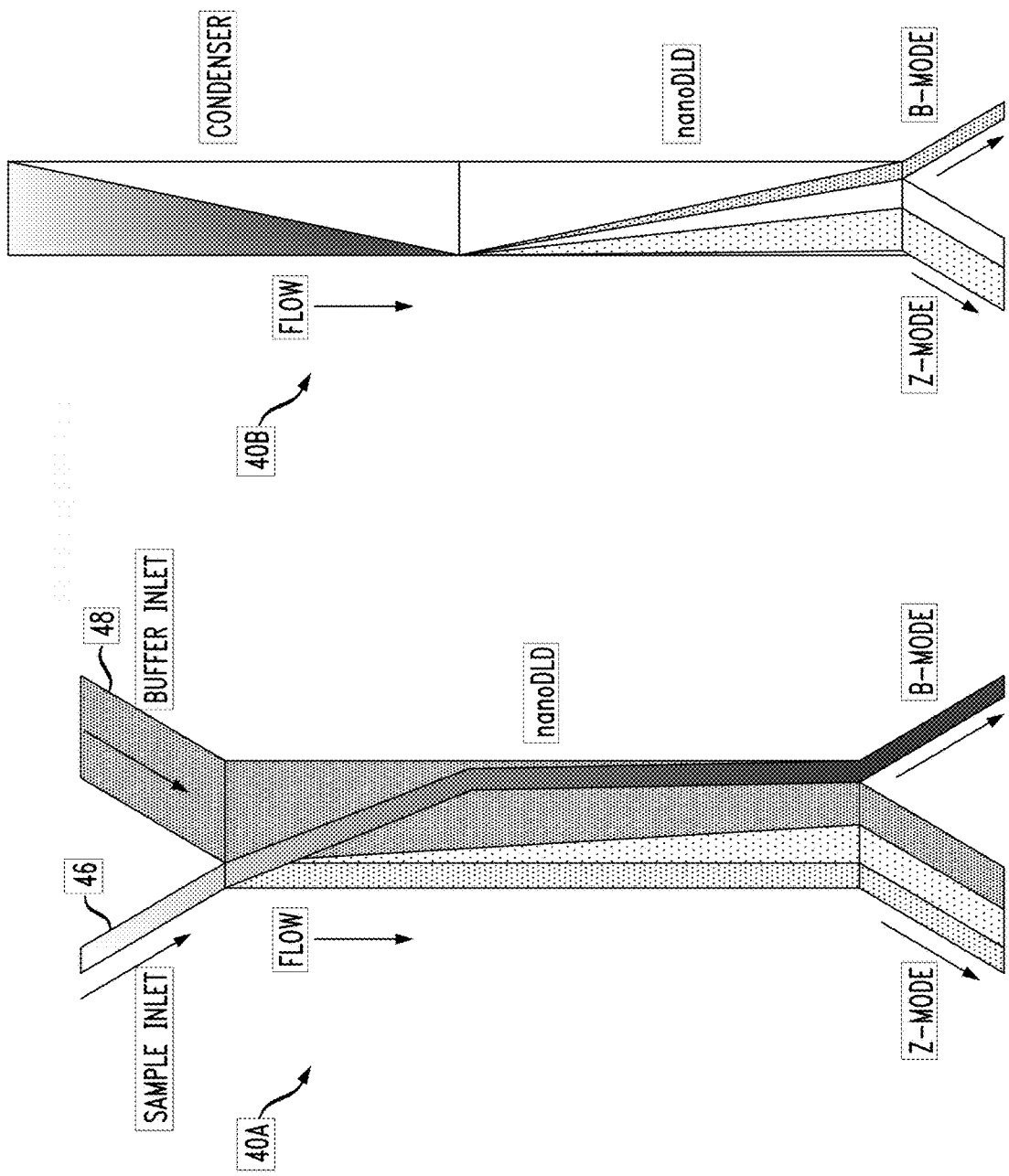
FIG. 8A is a schematic illustration of a hydrodynamic focused nanoDLD array.
FIG. 8B is a schematic illustration of a condenser focused nanoDLD array.

Synthesis in accordance with one or more embodiments of the invention uses two types of nanoDLDs to operate: a hydrodynamic focused array (HFA) 40A as schematically illustrated in FIG. 8A and a condenser focused array (CFA) 40B as schematically illustrated in FIG. 8B. Exemplary deterministic lateral displacement arrays are disclosed, for example, in US 2018/0078939 A1 and US 2019/0226953 A1, which are incorporated by reference herein. The HFA array uses two fluidic inputs into the array, a sample inlet 46 in which the species (core polymers, carrier polymers, links) are injected into the array, and a buffer inlet 48 in which pure solvent or buffer carrying no species is injected into the array. Two streams of fluid flow in parallel through the nanoDLD array and delineate two fluidic spaces. The lateral displacement effect of the nanoDLD array acts to move B-mode species from the sample stream into the buffer stream. This has two effects: purifying the species away from the others in the sample stream, and transferring the species into pure solvent or buffer. This later effect is important in cases in which the species must be separated from species that are not affected by the nanoDLD array (e.g. small molecules, colloids with $D_p$<10 nm).

The CFA uses a condenser nanostructure to collimate the sample stream into a high concentration, small lateral cross-section stream which is then injected into the nanoDLD. Microscale and/or mesoscale condenser arrays can facilitate microfluidic separation and/or purification of mesoscale and/or nanoscale particles. US 2019/0226953 A1 and US 2019/0224677 A1 disclose exemplary condenser devices that may be employed. Two streams are produced, one a concentrated sample stream and the other a cleared or emptied fluid stream which flow in parallel through the nanoDLD array and delineate two fluidic spaces. The small lateral cross-section of the concentrated sample stream compared to the emptied fluid stream gives a greater lateral space over which to separate individual species, enabling greater separation resolution. The single input required to operate the CFA, as opposed to the HFA, simplifies the nanoDLD device design and allows increased throughput. All proof-reading arrays (arrays 1, 2, 3 and 4) can be HFA types. Arrays 1, 2 and 3 can be CFA types. Array 4 should in general be a HFA type, as in general the molecular product will not be displaceable in the nanoDLD arrays, and therefore will flow out of both the Z-mode and B-mode outlets in the CFA, leading to some product loss. One alternative is to skip using array 4 for the final purification, and instead use a filter medium to remove the core/carrier polymers from the product solution.

The invention can be implemented in various structural forms. An embodiment of the invention comprises a fluidic device of microfluidic/nanofluidic networks with the nanoDLD arrays, a housing to hold the fluidic device, a set of valves to control the inlet of fluid into the fluidic device, a fluidic drive mechanism (e.g. pump, air compressor, compressed air canister, diaphragm, etc.) and any controllers (e.g. computer, microcontroller, switch box) to run the drive mechanism and (if desired) valves. Auxiliary components can include structures for controlling the loading and injection of sample into the fluidic device, sensors to monitor the operation of the device (e.g. flow rate, sample output, condition of the nanoDLD network), and automation to transfer sample fluid between parts of the fluidic device (e.g. fluidic pumps such as peristaltic, automated pipettors).

The number of nanoDLD arrays required depends on the requisite flow rates and sample volumes to be processed in a given synthetic cycle. In general, several nanoDLD arrays (100s to 10,000s) are integrated in parallel to practically process volumes in the >1 mL range. These massively parallel arrays are integrated into a fluidic network which comprises the fluidic device. Array integration has been disclosed in, for example, US 2017/0136460 A1, which is incorporated by reference herein. A typical implementation is to use nanolithography to produce the fluidic device in a silicon wafer. The fluidic device can be constructed in any material, including metal, plastics, ceramic, etc., so long as the material does not interact strongly with the polymer substrates or the molecular reagents or products. The fluidic device material is able to handle fabrication of nanoDLDs with appropriate geometric parameters. The geometric parameters for the nanoDLD typically are: gap sizes, G, of 50-500 nm, pillar dimensions, Do, of 100-400 nm, array pitch, A, of 200-1,000 nm, array depth, H, of 200-1,000 nm. These dimensions are applicable to both the CFA and HFA nanoDLD types. Arrays within these geometric parameter ranges are capable of displacing polymers of molecular weight ~1,000-1,000,000 Da, dependent on the particulars of the polymer structure. There is a nanoDLD network for each proof reading stage in the synthesis scheme (i.e. arrays 1, 2, 3 and 4 in FIGS. 3, 4). A network can be isolated such that inputs and outputs are isolated only to that network and must be transferred physically to another network. Networks can be linked together, either through macroscopic fluidic connections such as tubes, channels, or microscopic fluidic channels. A fluidic device can consist of a single nanoDLD network, or consist of tens, hundreds, thousands, etc. of networks, either in isolation or linked together. Valves or other control structures can be used to gate the transfer of fluids between any two networks.

The housing is any form of encasement or encapsulation which provides mechanical rigidity and strength to protect the fluidic device from mechanical stress or shock, and which carries any tubes, channels, feed-lines or other macroscopic fluidic connections necessary for plumbing together the fluidic device's nanoDLD networks. In the simplest embodiment this consists of ports which plumb to the inlets and outlets (Z-mode and B-mode outputs) of the fluidic device. More complex housings may contain automated loading ports, or components for handling fluid transfer, mixing, degassing, priming, sensing, etc. Embedded in the housing (or the fluidic device) is a series of valves. There is at least one valve for each nanoDLD network (proof reading stage), situated at the inlet side of the device. Additional valves can be added, for instance to gate the outputs of the fluidic device. The valves serve to isolate fluidic samples mechanically and provide an inlet for the fluidic drive mechanism (e.g. pressurized gas or fluid). Manual or automated valves may be employed. Valves can be connected independently to a drive mechanism, or connected to a manifold(s) which is connected to a single drive mechanism. Valves allow a single stage of separation to be run in isolation, allowing multiple stages of isolation to be run independently, eliminating the issue of synchronizing all processing stages of the synthetic scheme.

The drive mechanism is any equipment that can provide a mechanical driving force to push sample fluid through the nanoDLD networks. As mass transfer of both the sample and fluid is to occur, the drive mechanism should generally be pressurized gas or fluid. This can be any form of pump, compressor, compressed gas tank, or the like. The pressure can be delivered to the fluidic device through any tubing, hose, channel or other fluidic connector. The pressure can be distributed via manifolds to individual networks, via valves. Sensors, embedded in the housing, valves or fluidic device can be used to monitor the applied pressure or the pressure level(s) in the nanoDLD networks.

Figure 9:
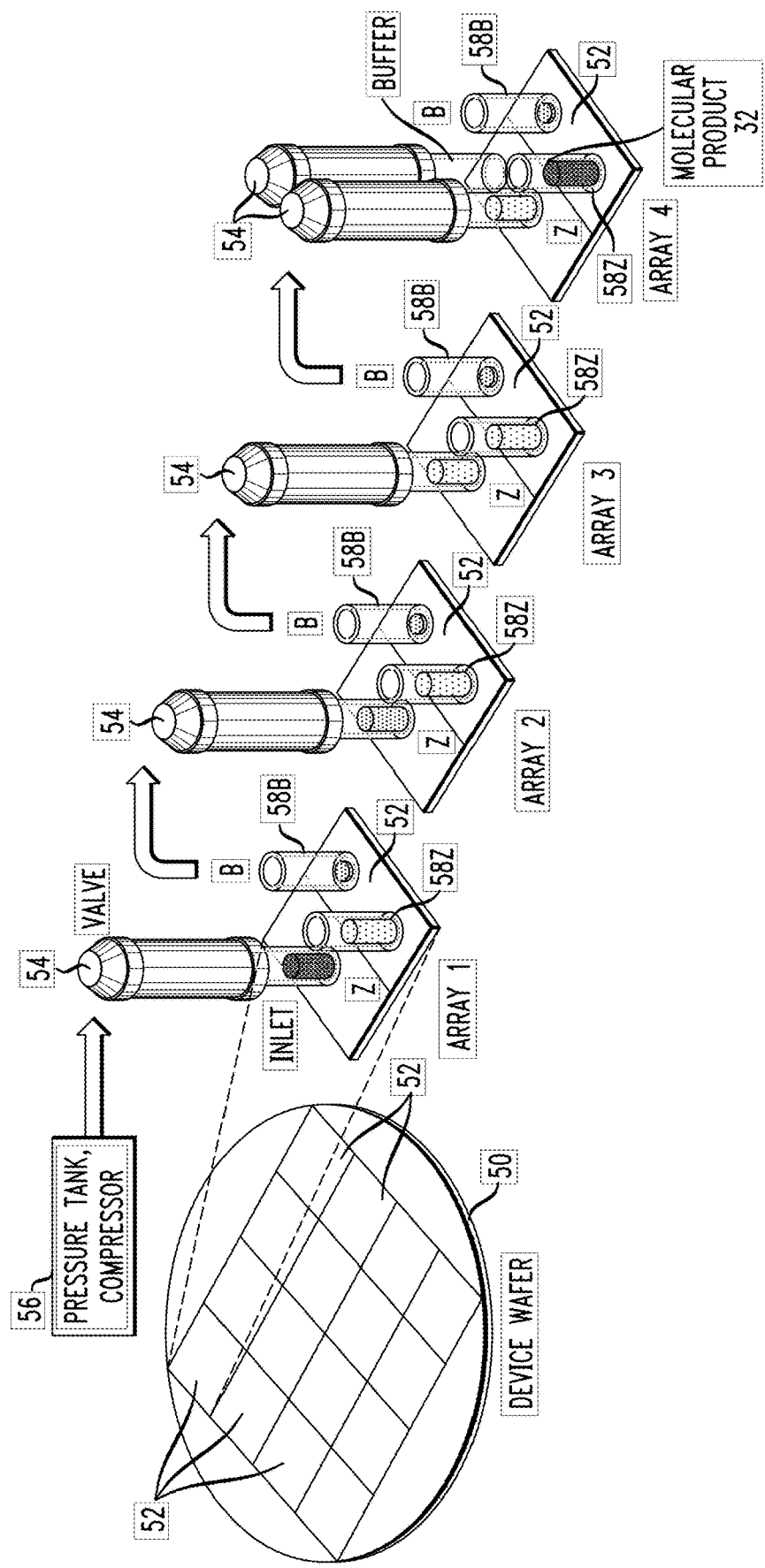
FIG. 9 is a schematic illustration of a system for executing the stages of a synthetic cycle including condensed focused nanoDLD arrays and a hydrodynamic focused nanoDLD array.

FIG. 9 provides a schematic illustration of one embodiment of the invention. The fluidic devices are fabricated using a silicon wafer (device wafer) 50. A single, isolated nanoDLD network is fabricated in a square footprint, comprising a sector or chip 52, with FIG. 9 showing a wafer with sixteen (16) individual nanoDLD networks in sixteen (16) chips. Each array needed for one proof reading stage of the synthetic scheme is comprised of a single chip in this embodiment. FIG. 9 shows an embodiment configured for performing, in sequence, four separation stages of a complete synthetic cycle plus product release represented by four chips. The inlets and outlets of each network are bonded to capillaries which store the sample fluids as they are injected into or emitted from the chip. A valve 54 is attached to the inlets of each chip. Pressurized air from a compressor 56 is the drive mechanism. Each valve 54 is plumbed to the compressor and can be opened to allow pressurization, closed to isolate the sample fluid, or vented to atmosphere. In this embodiment, each valve can be removed to allow manual sample loading/unloading, and manually operated to pressurize or vent. Pressurization of a sample fluid in the inlet begins the processing stage. Sample fluid is pushed into the chip, through the nanoDLD network (not shown in FIG. 9). The processed Z-mode and B-mode fluid outputs (shown schematically in FIGS. 8A and 8B) of the network are collected in two capillaries 58B, 58Z (B and Z modes). Once the input sample has been exhausted, the process is complete and the processed fluids can be removed and transferred to the next stage(s) of the synthetic cycle. In the embodiment depicted in FIG. 9, the fluid can be manually transferred to other capillaries or reactor vessels by hand using a pipet or bulb. Alternatively, peristaltic pumps, automated pipettors, automated fluid injectors, or other suitable elements could be positioned at each outlet to transfer fluid to downstream processes. Alternatively, pressure (e.g. from the drive mechanism) could be used to push fluids from one chip to the next for additional processing. In the exemplary embodiment pictured in FIG. 9, nanoDLD Arrays 1, 2 and 3 are CFA. Array 4 has two valves and two inlet capillaries, as required for a HFA. The sample and buffer inlets of Array 4 are driven by the same pressure source, which requires the nanoDLD network to be designed to account for both input streams to be driven by the same pressure. Alternatively, two separate drive mechanisms (pressures) could be used to drive each inlet separately. The final output, the released molecular product 32, appears in the Z-mode outlet of the array 4 chip in FIG. 9.

A fluidic device for performing the processes described herein can be disposable or reusable. A fluidic device could consist of several networks, each one being used once, until the entire device is used and then discarded. Devices can in general be reused until the nanoDLD network fails, which generally will occur from clogging. Clogging generally occurs when either particulates larger than the nanoDLD dimensions become trapped in the array network, or when smaller particles stick to the array or aggregate, forming larger particles that block the network. Clogs can be removed, the nature of this removal depending on the chemistry of the particles. Organic particles can be removed by chemical solvents (e.g. strong bases or acids, oxidizers, enzymes), photolytically, by gas phase reactants (e.g. ozone, halogens, oxygen), or by thermal degradation into gaseous products. Inorganic particles may be removed by chemical solvents or gas phase reactants. Reusable fluidic devices must be constructed of materials that can withstand the cleaning procedure(s) for removing clogs. It is appreciated that cleaning may change the nanoDLD geometry over time, requiring monitoring of the device behavior.

The molecular structure of the polymer determines its lateral displacement behavior. The persistent length, the presence of internal structure, supramolecular bonding, the length of the polymer, its solvation state, all affect the degree of displacement in a given nanoDLD array geometry. Although the displacement behavior can be predicted theoretically, it is generally appreciated that a set of calibration experiments will be required to determine the best nanoDLD array set for a new set of polymer substrate types, sizes.

It is appreciated that control of the flow velocity can be used to tune the separation resolution of polymer substrates in the nanoDLD array, as has been disclosed, for example, in US 2018/0080060 A1, the disclosure of which is incorporated by reference herein. It is further appreciated that the coupling of a molecular reagent to the polymer substrate, or the linking of two polymers at their end groups, may be highly inefficient. One advantage of one or more embodiments of the invention is the ability to recycle unreacted species that have been separated using the nanoDLD and feed them into previous stages to retry linking/fragmenting reactions and thus boost yields.

The ability to size separate three polymer species based on the length of the polymers facilitates one or more processes disclosed herein. One method for selecting the polymer sizes necessary for the core and carrier polymers (and thus link) is to generate the displacement efficiency plot as a function of polymer size for the polymer type for a given array geometry and flow rate. The displacement efficiency generally is a sigmoidal curve, with an inflection point at $L_o$. Generally, differences in displacement efficiency of 0.17-0.25 are sufficient to give separation resolutions of order ~1. The separation resolution can be improved by making longer nanoDLD arrays for cases where polymer species have similar displacement efficiencies. Examples of three dsDNA strand lengths sufficient for good resolution separation are:

| Gap size, G (nm) | 170 | 200 | 220 | 280 |
|---|---|---|---|---|
| Displacement efficiency difference ($\theta/\theta_{max}$) | 0.17 | 0.17 | 0.17 | <0.17 |
| Core, $L_1$ (kb) | 0.25 | 0.3 | 0.5 | 1.0 |
| Carrier, $L_2 = L_o$ (kb) | 0.5 | 0.7 | 1.0 | 2.0 |
| Link, $L_1 + L_2$ (kb) | 0.75 | 1.0 | 1.5 | 3.0 |

Figure 10:
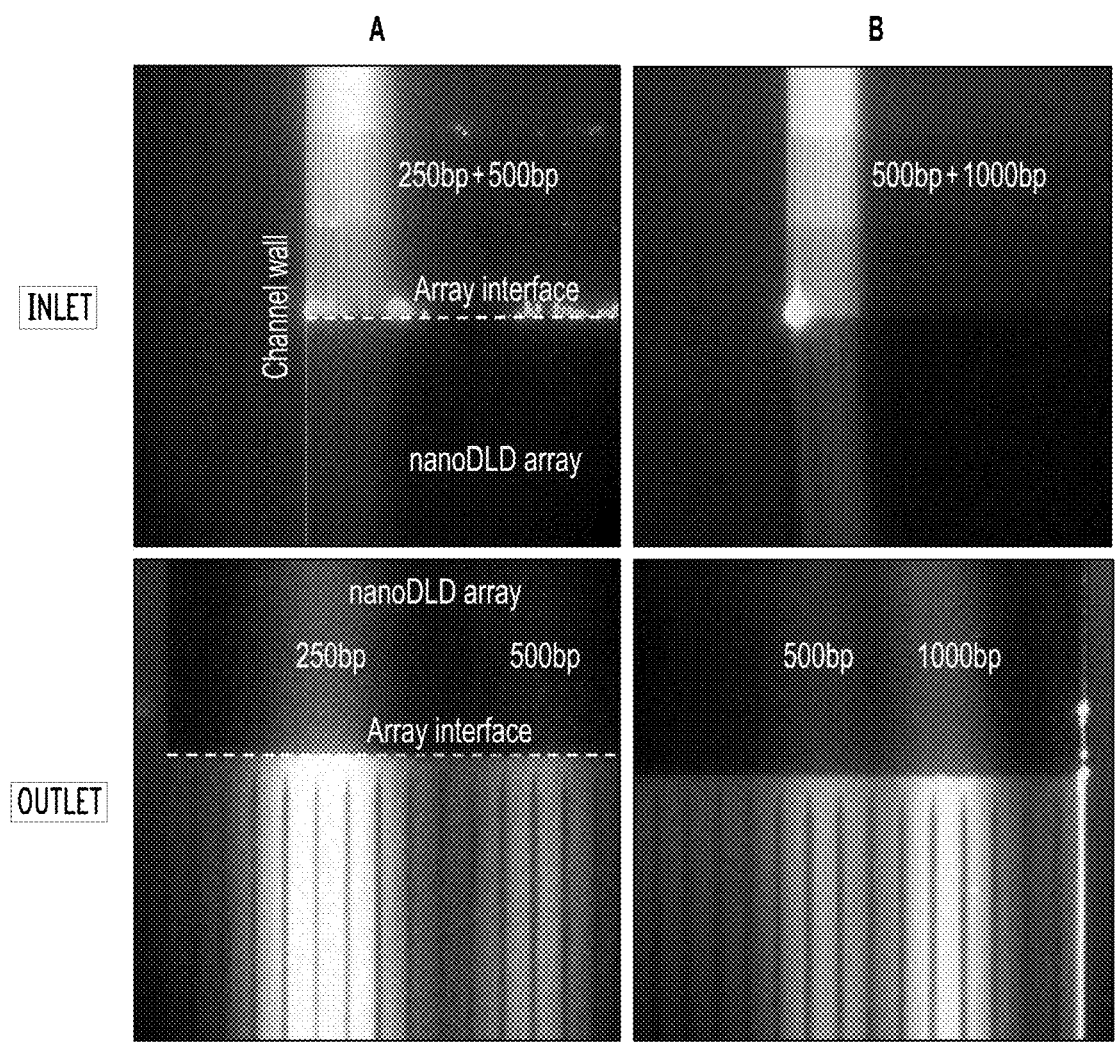
FIG. 10 shows experimental data for an exemplary embodiment of a three size separation of polymer species.

FIG. 10 shows experimental data for one embodiment of a three size separation of polymer species. The figure shows fluorescence microscope images of sample streams of dsDNA (YOYO-1 dyed, 10 ng $\mu L^{-1}$, 1×TE buffer) of sizes 250 bp, 500 bp and 1,000 bp. The dsDNA mixtures, 250 bp+500 bp (A) and 500 bp+1,000 bp (B) are both injected in a HFA of G=115 nm. Each mixture is separated into two streams which are visible at the outlet of the array. In this embodiment, a single array geometry is sufficient to separate the three strand sizes. In this embodiment, 250 bp is the carrier polymer, 500 bp is the core polymer, and 1,000 bp is the link species. In this embodiment, the link species is formed from one core and two carrier polymers.

To make core and carrier polymers, any polymer chemistry compatible with the requirements of the synthesis method can be used for the synthesis. Core and carrier polymers can be purified and separated into required lengths using a nanoDLD array(s). The same type of array(s) that will be used for the synthesis cycles can be used to initially purify core and carrier polymers from any polymer mixture of potentially any polydispersity through the "binning" action of the separation process. In this way, the arrays template the size bands of the polymers for future use.

It is appreciated that potential variations on the synthesis method could involve making tethering/linking bonds to residues (subunits) within the polymer core or carrier polymer instead of at the tail ends. It is further appreciated that this internal linking can change the displacement behavior of the link and require adjustment of the displacement conditions by altering the geometry of the nanoDLD arrays.

Given the discussion thus far, it will be appreciated that, in general terms, a method of synthesizing molecules includes providing a first mixture of core polymers 20A and carrier polymers 20B, the core polymers and the carrier polymers including tether bonds 24A, 24B and reagents 22A, 22B such as shown in stage A depicted in FIG. 1 and in FIG. 3A. Linking bonds 28 are formed between the core polymers and the carrier polymers, thereby obtaining a second mixture comprising link species 30 including the linking bonds, as shown in stage B of FIG. 1. The second mixture obtained in the method is further described with respect to FIG. 3B and FIG. 7 (element 35). The link species 30 is separated from the unreacted core polymers 20A and carrier polymers 20B remaining within the second mixture. The separation process includes flowing the second mixture through a first nanoDLD array (e.g. Array 1 in FIG. 3C, element 34-1 in FIG. 7) configured to separate the link species from the shorter, unreacted core polymers and carrier polymers. The link species are diverted away from the core polymers and the carrier polymers in the first nanoDLD array, as illustrated, for example, in FIGS. 3C and 3D. In one or more embodiments, the first nanDLD array has a cut-off length configured for displacing the link species with respect to the core polymers and the carrier polymers as a B-mode fraction.

The method for synthesizing molecules may further include fragmenting the link species 30 to form a third mixture (such as described with respect to FIG. 3E) including core+residue polymers (20AA in FIG. 1), spent carrier polymers (20BB) and unfragmented link species 30 and separating the unfragmented link species from the core and residue polymers and the spent carrier polymers. Such separation is conducted by flowing the third mixture through a second nanoDLD array (for example Array 2 in FIG. 3F) configured to separate the unfragmented link species 30 from the core+residue polymers 20AA and the spent carrier polymers 20BB. The second nanDLD array has a cut-off length configured for displacing the unfragmented link species with respect to the core+residue polymers and the spent carrier polymers as a B-mode fraction in one or more embodiments.

A further stage of the exemplary method includes uncoupling target molecules 32 from the core+residue polymers 20AA, thereby forming a target molecule mixture including the target molecules 32, spent core polymers (20AAA in FIG. 1), and spent carrier polymers 20BB. The target molecules 32 are then separated from the spent core polymers 20AAA and the spent carrier polymers 20BB in a purification stage (e.g. FIG. 3H). Separating the target molecules 32 from the spent core polymers 20AAA and the spent carrier polymers 20BB may include flowing the mixture through a hydrodynamic focused nanoDLD array (for example, Array 4 as depicted FIG. 3H) configured to separate the spent core polymers and the spent carrier polymers from the target molecules.

The illustrations of embodiments described herein are intended to provide a general understanding of the various embodiments, and they are not intended to serve as a complete description of all the elements and features of apparatus and systems that might make use of the techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can possibly be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications may be made therein by one skilled in the art without departing from the scope of the appended claims.

What is claimed is:

1. A method of synthesizing molecules, comprising:
providing a first mixture of core polymers and carrier polymers, the core polymers and the carrier polymers including tether bonds and reagents;
forming linking bonds between the core polymers and the carrier polymers, thereby obtaining a second mixture comprising link species including the linking bonds; and
separating the link species from the core polymers and the carrier polymers remaining within the second mixture, including:
flowing the second mixture through a first nanoDLD array configured to separate the link species from the core polymers and the carrier polymers; and
diverting the link species away from the core polymers and the carrier polymers in the first nanoDLD array; and
fragmenting the link species.

2. The method of claim 1, wherein the first nanDLD array has a cut-off length configured for displacing the link species with respect to the core polymers and the carrier polymers as a B-mode fraction.

3. The method of claim 1, wherein fragmenting the link species forms a third mixture including core plus residue polymers, spent carrier polymers and unfragmented link species; and further including:
separating the unfragmented link species from the core plus residue polymers and the spent carrier polymers, including flowing the third mixture through a second nanoDLD array configured to separate the unfragmented link species from the core plus residue polymers and the spent carrier polymers.

4. The method of claim 3, wherein the second nanDLD array has a cut-off length configured for displacing the unfragmented link species with respect to the core plus residue polymers and the spent carrier polymers as a B-mode fraction.

5. The method of claim 3, further including:
uncoupling target molecules from the core plus residue polymers, thereby forming a target molecule mixture including the target molecules, spent core polymers, and spent carrier polymers; and
separating the target molecules within the target molecule mixture from the spent core polymers and the spent carrier polymers.

6. The method claim 5, wherein separating the target molecules from the spent core polymers and the spent carrier polymers includes:
flowing the target molecule mixture through a hydrodynamic focused nanoDLD array configured to separate the spent core polymers and the spent carrier polymers from the target molecules.

7. The method claim 3, further including:
flowing the core plus residue polymers and the spent carrier polymers through a third nanoDLD array configured to separate the core plus residue polymers from the spent carrier polymers.

8. The method of claim 7, further including:
collecting the core plus residue polymers from the third nanoDLD array;
obtaining an initial mixture including the core plus residue polymers and further carrier polymers;
forming further linking bonds between the core plus residue polymers and the further carrier polymers, thereby obtaining further link species including the further linking bonds and the further carrier polymers.

9. The method of claim 8, wherein the further carrier polymers within the initial mixture include reagents having different molecular constituencies with respect to the reagents of the carrier polymers within the first mixture.

10. The method of claim 9, further including fragmenting the further link species.

11. The method of claim 3, wherein the tether bonds of the carrier polymers are configured to facilitate selective cleavage of the tether bonds of the carrier polymers with respect to the tether bonds of the core polymers.

12. The method of claim 11, wherein the tether bonds of the carrier polymers and the core polymers include orthogonal uncoupling chemistries.

13. The method of claim 1, wherein the reagents form end groups of the core polymers and the carrier polymers.

14. The method of claim 13, wherein fragmenting the link species includes uncoupling the reagents and linking bonds from the link species, thereby obtaining a target molecule mixture including target molecules, spent core polymers and spent carrier polymers.

15. The method of claim 14, further including separating the target molecules from the spent core polymers and the spent carrier polymers.

16. A system for synthesizing molecules, comprising:
a linking reactor for forming linking bonds between reagents connected, respectively, to core polymers and carrier polymers within a first mixture, thereby obtaining a second mixture comprising link species including the linking bonds;
a first nanoDLD array configured for separating the link species within the second mixture;
a fragmenting reactor configured for fragmenting the link species, thereby forming a third mixture including unfragmented link species, core plus residue polymers comprising the linking bonds, and spent carrier polymers;
a second nanoDLD array configured for separating the unfragmented link species from the core plus residue polymers and the spent carrier polymers within the third mixture; and
an uncoupling reactor configured for uncoupling target molecules comprising the linking bonds from the core plus residue polymers.

17. The system of claim 16, further including a compressor, and further wherein the first and second nanoDLD arrays each include an inlet and a valve mounted to the inlet, each of the valves being operatively connected to the compressor.

18. The system of claim 16, further including:
a third nanoDLD array configured for separating the core plus residue polymers from the spent carrier polymers.

19. The system of claim 18, further including a hydrodynamic focused nanoDLD array configured for causing the target molecules to enter into Z-mode.

20. The system of claim 16, further including a wafer comprising a plurality of discrete chips, the first nanoDLD array being on a first chip and the second nanoDLD array being on a second chip.

* * * * *